(12) United States Patent
Tanio et al.

(10) Patent No.: US 10,749,480 B2
(45) Date of Patent: Aug. 18, 2020

(54) TRANSMITTER, COMMUNICATION SYSTEM, AND METHOD AND PROGRAM FOR CONTROLLING TRANSMITTER

(71) Applicant: NEC Corporation, Minato-ku, Tokyo (JP)

(72) Inventors: Masaaki Tanio, Tokyo (JP); Wataru Hattori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/607,538

(22) PCT Filed: Apr. 26, 2018

(86) PCT No.: PCT/JP2018/016993
§ 371 (c)(1),
(2) Date: Oct. 23, 2019

(87) PCT Pub. No.: WO2018/199233
PCT Pub. Date: Nov. 1, 2018

(65) Prior Publication Data
US 2020/0076379 A1 Mar. 5, 2020

(30) Foreign Application Priority Data
Apr. 27, 2017 (JP) ................................. 2017-088950

(51) Int. Cl.
*H04K 1/02* (2006.01)
*H04L 25/03* (2006.01)
(Continued)

(52) U.S. Cl.
CPC ............. *H03F 1/3247* (2013.01); *H03F 3/24* (2013.01); *H04B 1/0483* (2013.01); *H04L 27/368* (2013.01); *H03F 2201/3233* (2013.01)

(58) Field of Classification Search
CPC .. H03F 1/3247; H03F 3/24; H03F 2201/3233; H03F 1/3241; H03F 1/3258; H04B 1/0483; H04L 27/368
(Continued)

(56) References Cited

U.S. PATENT DOCUMENTS

2009/0184763 A1* 7/2009 Kim ...................... H03F 1/3247
330/124 R
2011/0150130 A1* 6/2011 Kenington ............ H03F 1/3247
375/296
(Continued)

FOREIGN PATENT DOCUMENTS

JP 2010041470 A 2/2010
JP 2011019029 A 1/2011
(Continued)

OTHER PUBLICATIONS

J. Kim et al., "Digital predistortion of wideband signals based on power amplifier model with memory", Electronics Letters, vol. 37, No. 23, Nov. 2001, pp. 1417-1418 ( 2 pages total).
(Continued)

*Primary Examiner* — Phuong Phu

(57) ABSTRACT

A transmitter includes: a transmission circuit that outputs, via a transmission amplifier, transmission signals of a same frequency band; and a feedback circuit that feeds back, to the transmission circuit, a distortion compensation coefficient that is used to compensate for distortion of the transmission signals. The feedback circuit includes: a delay circuit that delays each of the transmission signals by a different amount of time; a combining unit that combines the delayed transmission signals to generate a combined signal; a signal conversion unit that converts a frequency of the combined signal to a different frequency using a local signal that is common among the transmission signals, and generates a demodulated digital signal from the combined signal
(Continued)

of which the frequency has been converted; and a distortion compensation calculation unit that calculates the distortion compensation coefficient based on the demodulated digital signal.

11 Claims, 10 Drawing Sheets

(51) Int. Cl.
  *H04L 25/49* (2006.01)
  *H03F 1/32* (2006.01)
  *H03F 3/24* (2006.01)
  *H04B 1/04* (2006.01)
  *H04L 27/36* (2006.01)

(58) Field of Classification Search
  USPC .......................................... 375/296, 297, 260
  See application file for complete search history.

(56) References Cited

U.S. PATENT DOCUMENTS

| | | | |
|---|---|---|---|
| 2015/0061762 A1* | 3/2015 | Charlon | H03F 1/3258 330/149 |
| 2018/0026586 A1* | 1/2018 | Carbone | H03F 1/3241 330/124 R |
| 2018/0219711 A1* | 8/2018 | Laporte | H04B 7/0617 |
| 2019/0052235 A1* | 2/2019 | Seo | H03F 1/3247 |
| 2020/0014412 A1* | 1/2020 | Hattori | H04B 1/0483 |

FOREIGN PATENT DOCUMENTS

| | | |
|---|---|---|
| JP | 2013046365 A | 3/2013 |
| JP | 2017046122 A | 3/2017 |
| WO | 2015190016 A1 | 12/2015 |
| WO | 2016084650 A1 | 6/2016 |

OTHER PUBLICATIONS

Dennis R. Morgan et al., "A Generalized Memory Polynomial Model for Digital Predistortion of RF Power Amplifiers", IEEE Transactions on Signal Processing, Oct. 2006, vol. 54, No. 10, pp. 3852-3860, (9 pages total).

D. Zhou et al., "Novel Adaptive Nonlinear Predistorters Based on the Direct Learning Algorithm", IEEE Transactions on Signal Processing, Jan. 2007, vol. 55, No. 1, pp. 120-133, (14 pages total).

International Search Report dated Jul. 17, 2018, in International Application No. PCT/JP2018/016993.

Written Opinion of the International Searching Authority dated Jul. 17, 2018, in International Application No. PCT/JP2018/016993.

* cited by examiner

ABSTRACT TRANSMITTER, COMMUNICATION SYSTEM, AND METHOD AND PROGRAM FOR CONTROLLING TRANSMITTER

This application is a National Stage Entry of PCT/JP2018/016993 filed on Apr. 26, 2018, which claims priority from Japanese Patent Application 2017-088950 filed on Apr. 27, 2017, the contents of all of which are incorporated herein by reference, in their entirety.

TECHNICAL FIELD

The present invention relates to a transmitter, a communication system, and a method and a program for controlling a transmitter.

BACKGROUND ART

With the spread of wireless communication systems such as mobile communication systems in recent years, there is a demand for higher performance of transceivers. In particular, low power consumption and low distortion are required in a transmitter. A digital pre-distortion (DPD) system is known as a distortion compensation method for achieving both linearity and power efficiency in a transmission amplifier. Further, as a means for realizing high-speed data communication, the application of MIMO (Multiple-Input Multiple-Output) transmission technology using a plurality of antennas and a transceiver circuit is required. In this case, the transmitter comes to have a plurality of transmission systems.

As a related technology, Patent Document 1 discloses, in a transmitter equipped with a DPD distortion compensation circuit having a plurality of transmission systems, performing updating of the inverse characteristic in the distortion compensation circuit of each transmission system in accordance with the error between transmission data of each transmission system and feedback transmission data corresponding to each of the transmission systems. By this process, distortion of the signal at the output of each transmission system of the transmitter is corrected, and the circuit scale in the transmitter is reduced.

PRIOR ART DOCUMENTS

Patent Documents

[Patent Document 1] Japanese Unexamined Patent Application, First Publication No. 2013-046365

SUMMARY OF THE INVENTION

Problem to be Solved by the Invention

When the technique described in Patent Document 1 is used, it is necessary to perform updating of the inverse characteristic by removing a portion of the power of the output signal of each transmission amplifier of a plurality of transmission systems and feeding back the portion to distortion compensation units of the plurality of transmission systems. When converting the output signal of each transmission amplifier of the transmission systems into an intermediate frequency signal having a mutually different frequency, local signals with different frequencies are required. Therefore, when employing the technique disclosed in Patent Document 1, if the number of transmission systems increases, the circuit scale of the local signal generation part that generates local signals also increases. As a result, the circuit scale of the transmitter inevitably increases.

An exemplary object of the present invention is to provide a transmitter, a communication system, and a method and a program for controlling a transmitter that can solve the above-described problems.

Means for Solving the Problem

A transmitter according to an exemplary aspect of the present invention includes: a transmission circuit that outputs, via a transmission amplifier, a plurality of transmission signals of a same frequency band; and a feedback circuit that feeds back, to the transmission circuit, a distortion compensation coefficient that is used to compensate for distortion of the plurality of transmission signals. The feedback circuit includes: a delay circuit that delays each of the plurality of transmission signals by a different amount of time; a combining unit that combines the plurality of delayed transmission signals to generate a combined signal; a signal conversion unit that converts a frequency of the combined signal to a different frequency using a local signal that is common among the plurality of transmission signals, the signal conversion unit generating a demodulated digital signal from the combined signal of which the frequency has been converted; and a distortion compensation calculation unit that calculates the distortion compensation coefficient based on the demodulated digital signal.

A transmission system according to the exemplary aspect of the present invention includes: the above-mentioned transmitter; and a receiver that receives a transmission signal transmitted by the transmitter.

A method for controlling a transmitter according to an exemplary aspect of the present invention is a method for controlling a transmitter that includes a transmission circuit, and includes: outputting a plurality of transmission signals of a same frequency band from the transmission circuit via a transmission amplifier; delaying each of the plurality of transmission signals by a different amount of time; combining the plurality of delayed transmission signals to generate a combined signal; converting a frequency of the combined signal to a different frequency using a local signal that is common among the plurality of transmission signals; generating a demodulated digital signal from the combined signal of which the frequency has been converted; calculating a distortion compensation coefficient that is used to compensate for distortion of the plurality of transmission signals, based on the demodulated digital signal; and feeding back the distortion compensation coefficient to the transmission circuit.

A program according to an exemplary aspect of the present invention causes a computer of a transmitter that includes a transmission circuit, to execute: outputting a plurality of transmission signals of a same frequency band from the transmission circuit via a transmission amplifier; delaying each of the plurality of transmission signals by a different amount of time; combining the plurality of delayed transmission signals to generate a combined signal; converting a frequency of the combined signal to a different frequency using a local signal that is common among the plurality of transmission signals; generating a demodulated digital signal from the combined signal of which the frequency has been converted; calculating a distortion compensation coefficient that is used to compensate for distortion of the plurality of transmission signals, based on the demodulated digital signal; and feeding back the distortion compensation coefficient to the transmission circuit.

Effect of the Invention

According to an exemplary embodiment of the present invention, it is possible to suppress an increase in the circuit scale.

EMBODIMENTS FOR CARRYING OUT THE INVENTION

First Exemplary Embodiment

Hereinbelow, an exemplary embodiment will be described in detail with reference to the drawings.

The constitution and processing of a transmitter 1 according to the first exemplary embodiment of the present invention will be described.

Figure 1:
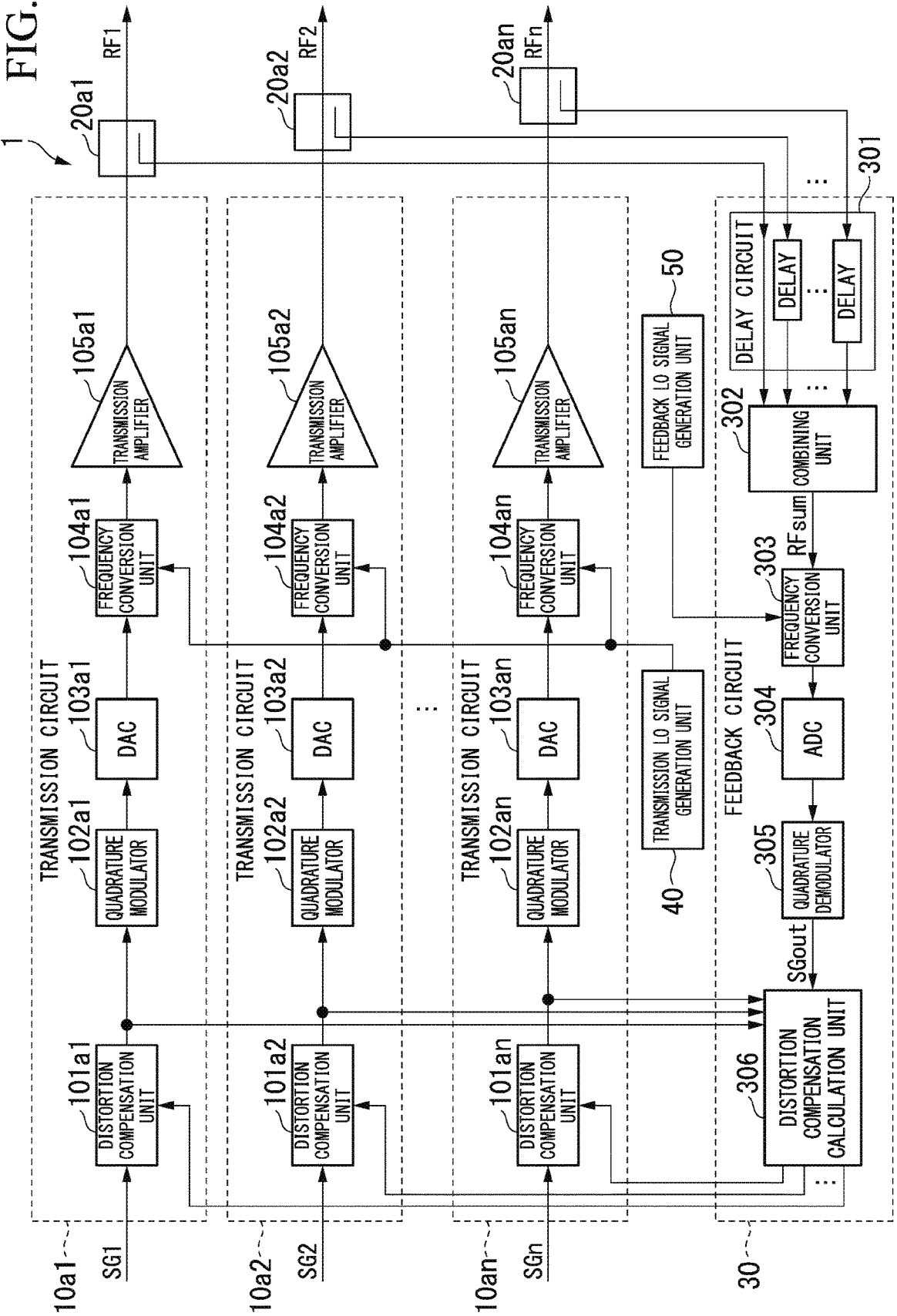
FIG. 1 is a diagram showing the constitution of a transmitter according to the first exemplary embodiment of the present invention.

The transmitter 1 according to the first exemplary embodiment of the present invention is a transmitter having a plurality of transmission systems, and by feeding back an RF (Radio Frequency) signal amplified by a transmission amplifier described later of each transmission system, can compensate for distortion of a signal mainly generated in the transmission amplifier. As shown in FIG. 1, the transmitter 1 includes transmission circuits $10a1$, $10a2$, ..., $10an$, signal branching units $20a1$, $20a2$, ..., $20an$, a feedback circuit 30, a transmission LO (local) signal generation unit 40, and a feedback LO signal generation unit 50. The transmission circuits $10a1$, $10a2$, ..., $10an$ are collectively referred to as transmission circuits $10a$. The signal branching units $20a1$, $20a2$, ..., $20an$ are collectively referred to as signal branching units $20a$.

The transmission circuit $10a1$ is a circuit that converts a transmission signal SG1 of the first transmission system among the first to nth transmission systems into an RF signal RF1 and transmits the RF signal RF1. The transmission circuit $10a1$ includes a distortion compensation unit $101a1$, a quadrature modulator $102a1$, a DAC (Digital to Analog Converter) $103a1$, a frequency conversion unit $104a1$, and a transmission amplifier $105a1$.

The transmission circuit $10a2$ is a circuit that converts a transmission signal SG2 of the second transmission system among the first to nth transmission systems into an RF signal RF2 and transmits the RF signal RF2. The transmission circuit $10a2$ includes a distortion compensation unit $101a2$, a quadrature modulator $102a2$, a DAC $103a2$, a frequency conversion unit $104a2$, and a transmission amplifier $105a2$.

The transmission circuit $10an$ is a circuit that converts a transmission signal SGn of the nth transmission system among the first to nth transmission systems into an RF signal RFn and transmits the RF signal RFn. The transmission circuit $10an$ includes a distortion compensation unit $101an$, a quadrature modulator $102an$, a DAC $103an$, a frequency conversion unit $104an$, and a transmission amplifier $105an$.

The distortion compensation units $101a1$, $101a2$, ..., $101an$ are collectively referred to as distortion compensation units $101a$. The quadrature modulators $102a1$, $102a2$, ..., $102an$ are collectively referred to as quadrature modulators $102a$. The DACs $103a1$, $103a2$, ..., $103an$ are collectively referred to as DACs $103a$. The frequency conversion units $104a1$, $104a2$, ..., $104an$ are collectively referred to as frequency conversion units $104a$. The transmission amplifiers $105a1$, $105a2$, ..., $105an$ are collectively referred to as transmission amplifiers $105a$.

Each of the distortion compensation units $101a$ performs signal processing so as to suppress distortion of the transmission signal with respect to the input signal on the basis of a distortion compensation coefficient corresponding to the power of the transmission signal of the system handled by the transmission circuit $10a$ including that distortion compensation unit $101a$. The distortion compensation coefficient is a distortion compensation coefficient output from a distortion compensation calculation unit 306 described later. Specific examples of signal processing performed by the distortion compensation units $101a$ may include signal processing that uses a method such as a series method such as a Volterra series, a memory polynomial, and a generalized memory polynomial, and an LUT (Look Up Table) method that performs an operation equivalent to the series method using an LUT.

For example, when performing signal processing based on a memory polynomial, the distortion compensation units $101a$ can perform calculation using the technique disclosed in J. Kim and K. Konstantinou, "Digital predistortion of wideband signals based on power amplifier model with memory," ELECTRONICS LETTERS, Vol. 37, no. 23, pp. 1417-1418, November 2001. For example, when performing signal processing based on a generalized memory polynomial, the distortion compensation units $101a$ can perform calculation using the technique disclosed in D. R. Morgan, Z. Ma, J. Kim, M. G. Zierdt, and J. Pastalan, "A generalized memory polynomial model for digital. predistortion of RF power amplifiers," IEEE Trans. Signal Process., vol. 54, no. 10, pp. 3852-3860, October 2006.

Each of the distortion compensation units 101a generates an orthogonal I signal and Q signal (hereinafter referred to as "IQ signals") after the signal processing, and outputs the IQ signals to the corresponding orthogonal modulator 102a and the distortion compensation calculation unit 306.

Each of the quadrature modulators 102a performs digital signal processing to convert the IQ signals after the signal processing by the distortion compensation units 101a into a digital IF (Intermediate Frequency) signal. Each of the quadrature modulators 102a outputs the digital IF signal to the corresponding DAC 103a.

Each of the DACs 103a generates an analog IF signal by D/A converting the digital IF signal received from the corresponding quadrature modulator 102a. Each of the DACs 103a outputs the generated analog IF signal to the corresponding frequency conversion unit 104a.

At this time, the transmission LO signal generation unit 40 generates a transmission LO signal and outputs the generated transmission LO signal to each of the frequency conversion units 104a. Here, the transmission LO signal is a signal having a predetermined constant frequency, and the frequency is set to a frequency lower than the center frequency of the RF signal output from each transmitter 1.

Each of the frequency conversion units 104 generates an RF signal by frequency-converting the analog IF signal received from the corresponding DAC 103a using the transmission LO signal received from the transmission LO signal generation unit 40. Each of the frequency conversion units 104a outputs the generated RF signal to the corresponding transmission amplifier 105.

Each of the transmission amplifiers 105a amplifies the RF signal received from the frequency conversion unit 104a. Each of the transmission amplifiers 105a transmits the amplified RF signal to the receiver 2. In this way, each of the transmission circuits 10a generates an RF signal and transmits the generated RF signal to the receiver 2.

Each of the signal branching units 20a is, for example, a coupler such as a directional coupler. Each of the signal branching units 20a branches a part of the power of the RF signal generated by the transmission amplifier 105a of the transmission circuit 10a corresponding to the signal branching unit 20a as the amplitude of the RF signal. Each of the signal branching units 20a outputs the branched RF signal (hereinafter referred to as a "branched RF signal") to the feedback circuit 30.

The feedback circuit 30 is a circuit that feeds back to the corresponding distortion compensation unit 101a a distortion compensation coefficient calculated on the basis of a part of the power of the RF signal generated by the transmission amplifier 105a in order to compensate for distortion of the RF signal generated mainly in each of the transmission amplifiers 105a. As shown in FIG. 1, the feedback circuit 30 includes a delay circuit 301, a combining unit 302, a frequency conversion unit 303 (one of the signal conversion units), an ADC (Analog to Digital Converter) 304 (one of the signal conversion units), a quadrature demodulator 305 (one of the signal conversion units), and a distortion compensation calculation unit 306.

Figure 2:
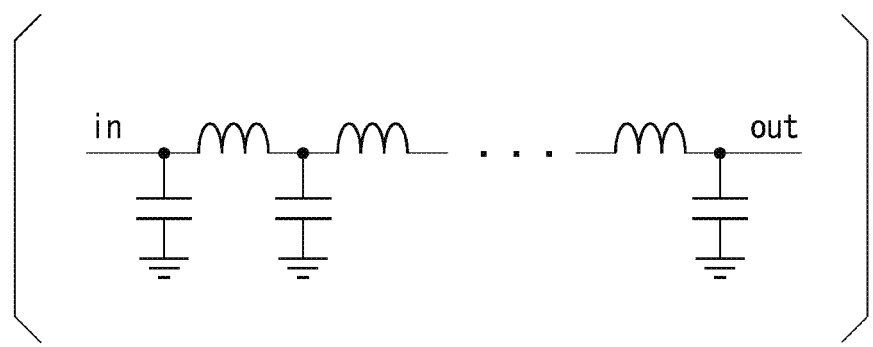
FIG. 2 is a diagram for describing a delay circuit in the first exemplary embodiment of the present invention.

The delay circuit 301 delays each part of the power of the RF signals received from the signal branching units 20a of the first to nth transmission systems by a desired delay time. The delay circuit 301 outputs each part of the power of the delayed RF signal (hereinafter referred to as "delayed RF signal") to the combining unit 302. The desired delay time here is a time that differs for each of the first to nth transmission systems. Also, in the delay circuit 301, the difference between adjacent delay times when the delay times of the respective delayed RF signals are arranged in an order starting from the shortest is set to a sufficiently long time compared to the time required for signal modulation. Specifically, for example, when the delay RF signal has a bandwidth of 100 MHz, in the delay circuit 301, the difference between adjacent delay times when the delay times of the delayed RF signals are arranged in an order starting from the shortest is set to be about 100 ns, which is 10 times 10 ns, the reciprocal of the bandwidth of 100 MHz. As the delay circuit 301 that realizes such a difference between adjacent delay times, a circuit may be used in which values of inductors and capacitors are adjusted, in a transmission line such as a coaxial cable or a passive circuit in which a transmission line as shown in FIG. 2 is modeled using a lumped constant (here, as an example, the transmission line is one regarded as lossless). Each of the differences between the adjacent delay times may be set to the same value.

As described above, by the delay circuit 301 delaying a part of the power of each of the RF signals received from the first to nth transmission systems by a desired delay time, it is possible to reduce the influence between the delayed RF signals. An output combined signal S Gout described later can be separated for each delayed RF signal in the subsequent stage.

The combining unit 302 receives each delayed RF signal from the delay circuit 301. The combining unit 302 generates one RF signal RFsum by adding each delayed RF signal that has been received on the time axis. The combining unit 302 outputs the generated RF signal RFsum (combined signal) to the frequency conversion unit 303.

At this time, the feedback LO signal generation unit 50 generates a feedback LO signal, and outputs the generated feedback LO signal to the frequency conversion unit 303. Here, the feedback LO signal is a signal used when the frequency conversion unit 303 generates a modulation signal.

The frequency conversion unit 303 receives the RF signal RFsum from the combining unit 302. Further, the frequency conversion unit 303 receives the feedback LO signal from the feedback LO signal generation unit 50. The frequency conversion unit 303 generates a combined IF signal by converting the frequency of the RF signal RFsum using the feedback LO signal. The frequency conversion unit 303 outputs the generated combined IF signal to the ADC 304.

The ADC 304 receives the combined IF signal from the frequency conversion unit 303. The ADC 304 converts the received combined IF signal into a digital signal. The ADC 304 outputs the combined IF signal that has been converted to a digital signal to the quadrature demodulator 305.

The quadrature demodulator 305 receives from the ADC 304 the combined IF signal that has been converted into a digital signal. The quadrature demodulator 305 converts the received combined IF signal that has been converted into a digital signal into a digital baseband signal, and generates an output combined signal SGout. The quadrature demodulator 305 outputs the output combined signal SGout to the distortion compensation calculation unit 306.

The distortion compensation calculation unit 306 receives, from each of the distortion compensation units 101a, the IQ signals after being subjected to signal processing. Further, the distortion compensation calculation unit 306 receives the output combined signal S Gout from the quadrature demodulator 305.

On the basis of the delay times corresponding to the first to nth transmission systems set by the delay circuit 301, the distortion compensation calculation unit 306 separates the output combined signal SGout into signals respectively corresponding to the first to nth transmission systems.

Specifically, for example, the distortion compensation calculation unit 306 acquires from the delay circuit 301 the timing at which the delay circuit 301 received a part of the power of the RF signal from each signal branching unit 20a of the first to nth transmission systems. The distortion compensation calculation unit 306 divides the output combined signal S Gout into delay times set by the delay circuit 301 on the basis of the acquired timings, thereby separating the output combined signal SGout into signals respectively corresponding to each of the first to nth transmission systems.

Further, the distortion compensation calculation unit 306 extracts the distortion characteristic in each of the transmission amplifiers 105a of the first to nth transmission systems. The distortion compensation calculation unit 306 calculates an inverse characteristic that cancels the extracted distortion characteristic for each of the transmission amplifiers 105a. The distortion compensation calculation unit 306 outputs a compensation parameter (that is, a distortion compensation coefficient) that realizes the calculated inverse characteristic to each of the distortion compensation units 101a. Note that the compensation parameter that realizes the inverse characteristic that cancels the distortion characteristic may be acquired by performing experiments or simulations in advance on various signals expected to be output from the transmission circuits 10a. The distortion compensation calculation unit 306 stores the correspondence relationship between the distortion characteristics and compensation parameters. From the various signals expected to be output from the transmission circuits 10a, the distortion compensation calculation unit 306 specifies a signal similar to each signal obtained by separating the output combined signal SGout. Then, the distortion compensation calculation unit 306 specifies a compensation parameter from the correspondence relationship between the distortion characteristic and the compensation parameter stored in advance for each specified signal, and outputs the specified compensation parameter to each of the distortion compensation units 101a.

Hereinbelow, an example of the distortion characteristic extraction method by the transmission amplifiers 105a will be described.

First, the output combined signal output from the quadrature demodulator 305 is modeled using the calculation model represented by Equation (1) including the memory polynomial of the transmission amplifiers 105a, the delay time of the delay circuit 301, and the influence of the combining unit 302.

[Equation 1]

$$z(t) = \sum_{i=1}^{n} \sum_{\tau=0}^{T} \sum_{d=0}^{D} g_{i,\tau,d} x_i(t-\tau-Td_i)|x_i(t-\tau-Td_i)|^d \quad (1)$$

Here, "$Td_i$" represents a delay time of a signal in the transmission circuit 10ai (i=1 to n). "$g_{i,\tau,d}$" represents a parameter indicating the distortion characteristic of the transmission amplifier 105a in the transmission circuit 10ai (i=1 to n). "T" represents the maximum value of tap set in the distortion characteristic. "D" represents the maximum value of the degree of the polynomial set in the distortion characteristic. represents an input signal in a complex notation. Each of "d" and "τ" represents a variable.

It is one of the characteristics of the transmitter 1 according to the exemplary embodiment of the present invention that the output combined signal output from the quadrature demodulator 305 is modeled using the calculation model represented by Equation (1). By using Equation (1) as a calculation model for calculating the sum of i from 1 to n, a calculation model that can represent a state in which a plurality of signals having different delay times are mixed is realized.

The RF signal RFsum output from the combining unit 302 is represented by adding the parameters $g_{i,\tau,d}$ indicating the distortion characteristic of the transmission amplifier 105a of each of the transmission circuits 10ai (that is, each of the transmission circuits 10a).

Here, an error E between z(t) modeling the output combined signal and the output combined signal SGout actually obtained as the output of the quadrature demodulator 305 is defined as shown in Equation (2).

[Equation 2]

$$E = \sqrt{\Sigma |SGout - z(t)|^2} \quad (2)$$

This error E is a value determined by the parameter $g_{i,\tau,d}$ of the distortion characteristic of the transmission amplifier 105a and the delay time $Td_i$, and takes a minimum value when both are optimum values. Therefore, by calculating the parameter $g_{i,\tau,d}$ and the delay time $Td_i$ that minimize the error E by the optimization calculation represented by the following Equation (3), the optimum parameter $g_{i,\tau,d}$ and the delay time $Td_i$ can be obtained at the same time.

[Equation 3]

$$\min_{Td_1,\ldots,Td_n} \left( \min_{g_{1,0,0},\ldots,g_{n,T,D}} E \right) \quad (3)$$

As described above, once the distortion characteristic parameter $g_{i,\tau,d}$ of the transmission amplifier 105a is calculated, it is possible to calculate the inverse distortion characteristic, which is the inverse characteristic of the distortion characteristic, using the distortion compensation algorithm described in, for example, D. Zhou and V. E. DeBrunner, "Novel Adaptive Nonlinear Predistorters Based on the Direct Learning Algorithm," IEEE Trans. Signal Process., Vol. 55, no. 1, pp. 120-133, January 2007.

The transmitter 1 according to the first exemplary embodiment of the present invention has been described above.

The transmitter 1 according to the first exemplary embodiment of the present invention includes a plurality of transmission circuits 10a and a feedback circuit 30. The plurality of transmission circuits 10a generate signals in the same frequency band. The feedback circuit 30 feeds back to the transmission circuit 10a that has output a transmission amplification signal, among the plurality of transmission circuits 10a, a distortion compensation coefficient calculated on the basis of a part of the power of the transmission amplification signal output from each of the plurality of transmission circuits 10a via the transmission amplifier 105a, with the feedback circuit 30 being shared by the plurality of transmission circuits 10a. The feedback circuit 30 includes the delay circuit 301, the combining unit 302, the signal conversion units (frequency conversion unit 303, ADC 304, quadrature demodulator 305), and a distortion compensation calculation unit 306. The delay circuit 301 delays each of the transmission amplification signals by a different amount of time. The combining unit 302 combines each of the signals delayed by the delay circuit 301 to generate a combined signal. The signal conversion units convert the combined signal generated by the combining unit 302 to a different frequency using a common local signal for the plurality of transmission systems of the same frequency, and generate a demodulated digital signal from the signal following conversion. On the basis of the demodulated digital signal, the distortion compensation calculation unit 306 calculates a distortion compensation coefficient used when compensating for signal distortion in each of the outputs of the plurality of transmission circuits 10a.

According to such a configuration, the transmission amplification signal corresponding to each transmission system is separated in the time axis direction by the delay circuit 301, and the signal combined as one signal by the combining unit 302 can be separated into signals corresponding to each transmission system by signal processing in the subsequent stage. If the signal can be separated into signals corresponding to each transmission system, the distortion correction amount of each transmission system can be calculated.

In this way, the transmitter 1 according to the first exemplary embodiment of the present invention can use the transmission LO signal generation unit 40 and the feedback LO signal generation unit 50 that are common to the first to nth transmission systems, and can compensate for distortion of the output of the transmission amplifiers 105a of the first to nth transmission systems without widening the frequency band. As a result, an increase in the number of feedback LO signal generation units and the performance of the ADC 304 can be suppressed, an increase in the circuit scale of the transmitter 1 can be suppressed, and the cost and power consumption can be reduced.

In the transmitter 1, the modulation in the transmission circuit 10a and the demodulation in the feedback circuit 30 may be a superheterodyne system. In the transmitter 1, the modulation in the transmission circuit 10a may be a superheterodyne system, and the demodulation in the feedback circuit 30 may be a direct-conversion system. In the transmitter 1, the modulation in the transmission circuit 10a and the demodulation in the feedback circuit may be a direct-conversion system. In the transmitter 1, the modulation in the transmission circuit 10a may be a direct-conversion system and the demodulation in the feedback circuit 30 may be a superheterodyne system.

In this way, the transmitter 1 according to the first exemplary embodiment of the present invention can support various combinations of a superheterodyne system and a direct-conversion system for the modulation in the transmission circuit 10a and the demodulation in the feedback circuit 30.

Second Exemplary Embodiment

Next, a transmitter 1 according to a second exemplary embodiment of the present invention will be described.

The transmitter 1 according to the first exemplary embodiment of the present invention has a digital beamforming structure. On the other hand, the transmitter 1 according to the second exemplary embodiment of the present invention has an analog beamforming structure.

Figure 3:
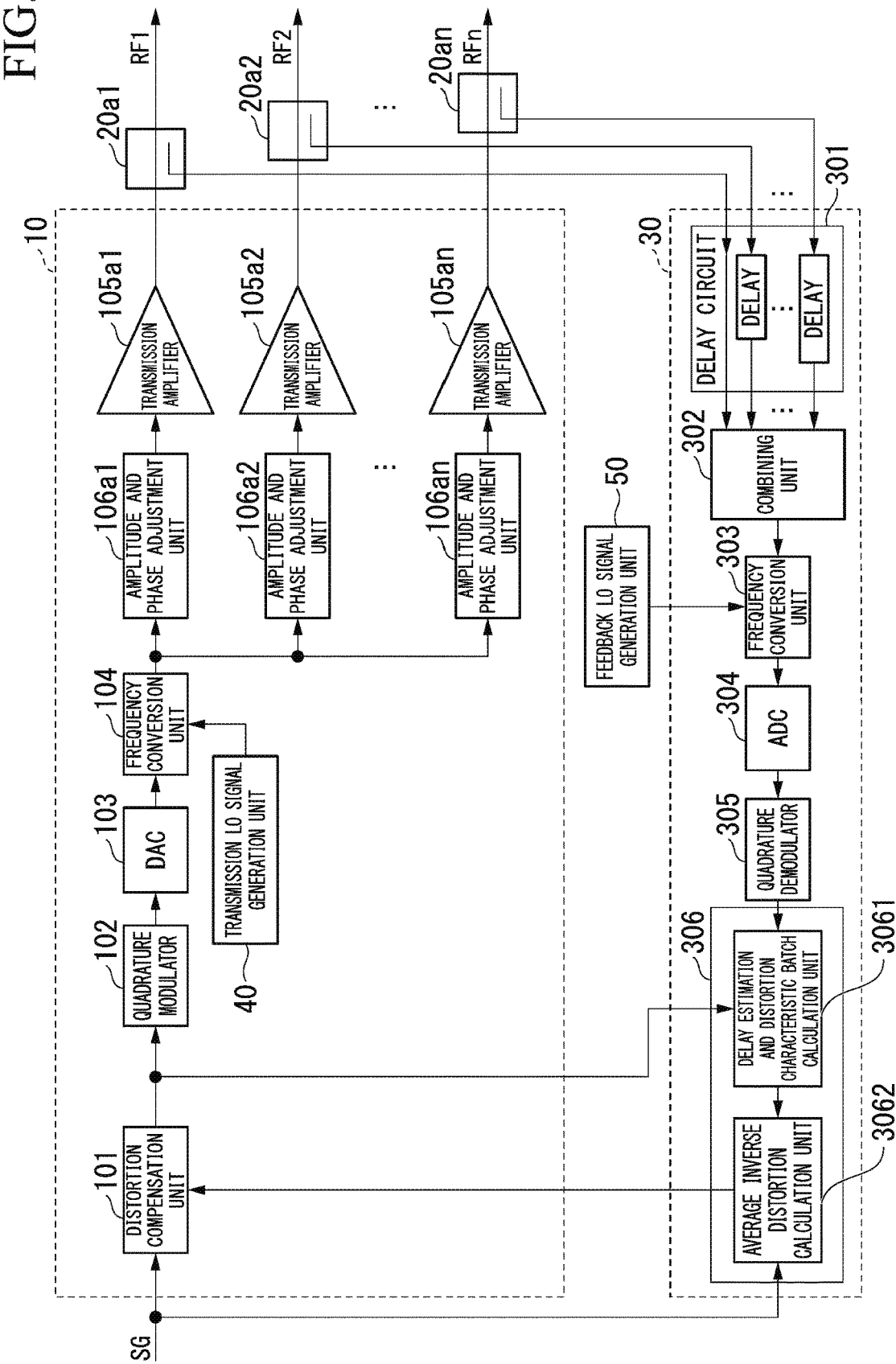
FIG. 3 is a diagram showing the constitution of a transmitter according to the second exemplary embodiment of the present invention.

As shown in FIG. 3, the transmitter 1 according to the second exemplary embodiment of the present invention includes a transmission circuit 10, signal branching units 20a1, 20a2, . . . , 20an, a feedback circuit 30, a transmission LO signal generation unit 40, and a feedback LO signal generation unit 50.

The transmission circuit 10 is a circuit that converts the transmission signal SG into RF signals corresponding to the first to nth plurality of transmission systems and transmits the RF signals. The transmission circuit 10 includes a distortion compensation unit 101, a quadrature modulator 102, a DAC (Digital to Analog Converter) 103, a frequency conversion unit 104, transmission amplifiers 105a1, 105a2, . . . , 105an, and amplitude and phase adjustment units 106a1, 106a2, . . . , 106an. The amplitude and phase adjustment units 106a1, 106a2, . . . , 106an are collectively referred to as amplitude and phase adjustment units 106a.

Each of the amplitude and phase adjustment units 106a receives the RF signal output from the frequency conversion unit 104. Each of the amplitude and phase adjustment units 106a adjusts the amplitude value and phase value of the received RF signal and outputs an adjusted RF signal. The amplitude value and the phase value adjusted by each of the amplitude and phase adjustment units 106a are determined according to the beamforming beam pattern. Each of the amplitude and phase adjustment units 106a is configured by an analog circuit such as a VGA (Variable Gain Amplifier) or a phase shifter, for example.

As shown in FIG. 3, the feedback circuit 30 includes a delay circuit 301, a combining unit 302, a frequency conversion unit 303 (one of the signal conversion units), an ADC 304 (one of the signal conversion units), a quadrature demodulator 305 (one of the signal conversion units), and a distortion compensation calculation unit 306.

The distortion compensation calculation unit 306 according to the first exemplary embodiment receives the output signal of the combining unit 302 and the output signal of the distortion compensation unit 101 in a state of having extracted the distortion characteristics of all the transmission amplifiers 105a by the same method as the distortion compensation calculation unit 306 according to the first exemplary embodiment of the present invention. The distortion compensation calculation unit 306 includes a delay estimation and distortion characteristic batch calculation unit 3061 that calculates distortion characteristics on the basis of these output signals, and an average inverse distortion calculation unit 3062 that calculates an average distortion characteristic by averaging the calculated distortion characteristics. By calculating the average distortion characteristic by averaging the distortion characteristics, the number of distortion characteristics can be reduced. The distortion compensation calculation unit 306 calculates a parameter of the inverse distortion characteristic of the calculated average distortion characteristic and outputs the parameter to the distortion compensation unit 101.

The transmission circuit 10 according to the second exemplary embodiment of the present invention is merely an example of an analog beamforming transmission circuit. The transmission circuit 10 according to another exemplary embodiment of the present invention may be an analog beamforming transmission circuit according to another configuration.

The transmission circuit 10 according to another exemplary embodiment of the present invention may be an analog/digital hybrid beamforming transmission circuit. In that case, the number of distortion compensation units when there are three or more transmission systems is either two or more and less than or equal to the number of transmission systems, and correspondingly, the number of combinations of the average distortion characteristic and the inverse distortion characteristics thereof generated by the distortion compensation calculation unit 306 are the same as the number of distortion compensation units.

The transmitter 1 according to the second exemplary embodiment of the present invention has been described above.

In the transmitter 1 according to the second exemplary embodiment of the present invention, each of the amplitude and phase adjustment units 106a receives the RF signal output from the frequency conversion unit 104. Each of the amplitude and phase adjustment units 106a adjusts the amplitude value and phase value of the received RF signal and outputs an adjusted RF signal. The distortion compensation calculation unit 306 according to the second exemplary embodiment extracts the distortion characteristics of all the transmission amplifiers 105a by the same method as the distortion compensation calculation unit 306 according to the first exemplary embodiment of the present invention, and then calculates the average distortion characteristic by averaging the characteristics. The distortion compensation calculation unit 306 calculates a parameter of the inverse distortion characteristic of the calculated average distortion characteristic and outputs the parameter to the distortion compensation unit 101.

In this way, the configuration of the transmitter 1 according to the second exemplary embodiment of the present invention can be an analog beamforming structure. As a result, it is possible to use the transmission LO signal generation unit 40 and the feedback LO signal generation unit 50 that are common to the first to nth plurality of transmission systems for more types of transmitters 1 and to compensate for distortion of the output of the transmission amplifiers 105a of the first to nth transmission systems without widening the frequency band. As a result, an increase in the number of feedback LO signal generation units and the performance of the ADC 304 can be suppressed, an increase in the circuit scale of the transmitter 1 can be suppressed, and cost and power consumption can be reduced.

The distortion compensation calculation unit 306 according to another exemplary embodiment of the present invention may use input signals SG1 to SGn instead of the output signals of the distortion compensation units 101a when calculating the distortion characteristics and the inverse distortion characteristics. Also, the distortion compensation calculation unit 306 according to another exemplary embodiment of the present invention may use both the output signals of the distortion compensation units 101a and the input signals SG1 to SGn when calculating the distortion characteristics and the inverse distortion characteristics.

The transmitter 1 according to the first exemplary embodiment of the present invention uses a superheterodyne (IF) system for both transmission and feedback. However, the transmitter 1 according to the exemplary embodiment of the present invention is not limited to one using the superheterodyne (IF) system in both transmission and feedback.

Figure 4:
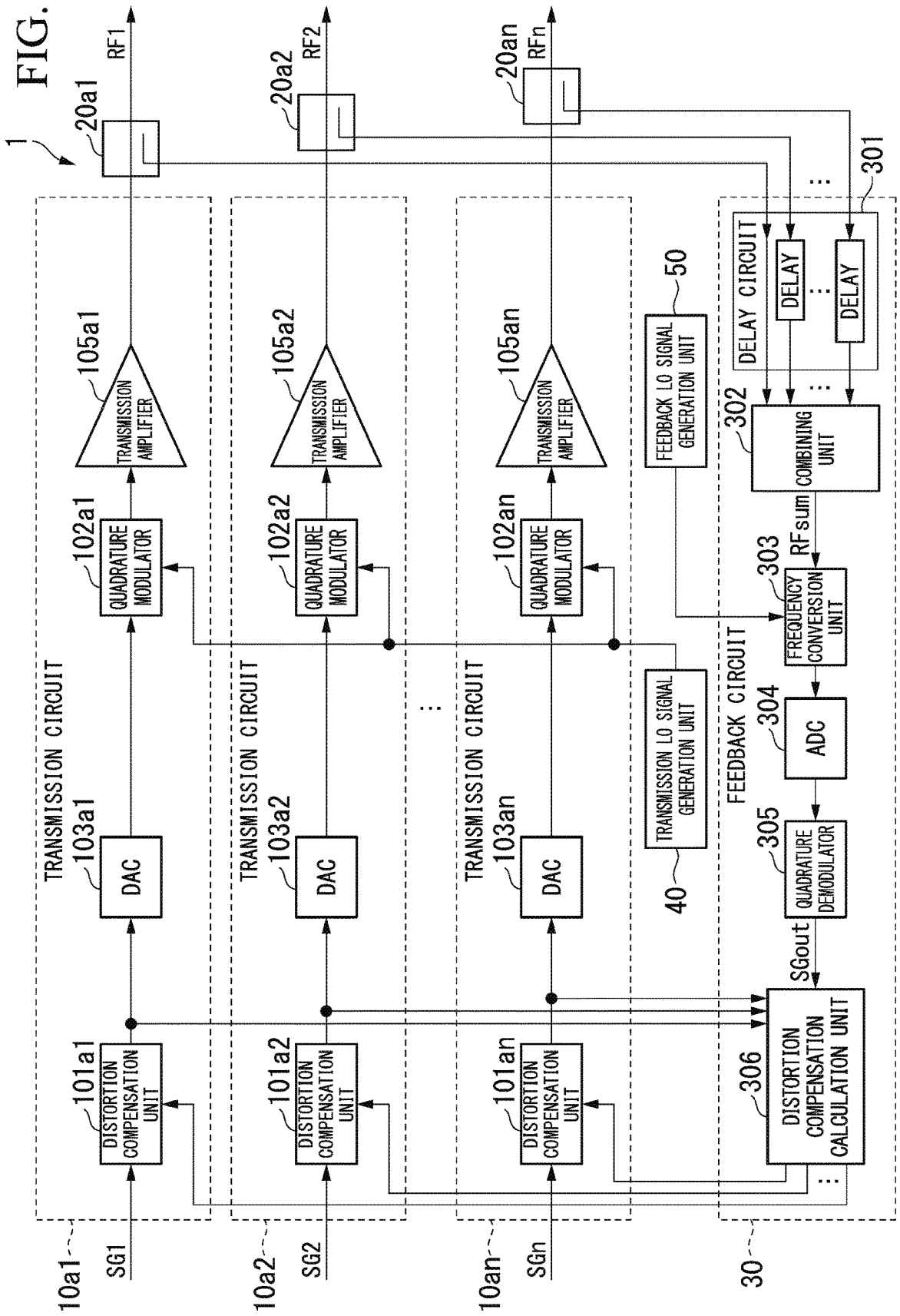
FIG. 4 is a diagram showing the constitution of a transmitter according to another exemplary embodiment of the present invention.

Specifically, for example, as shown in FIG. 4, the transmitter 1 according to another exemplary embodiment of the present invention may use a direct-conversion (zero IF) system for transmission and the superheterodyne system for feedback.

Figure 5:
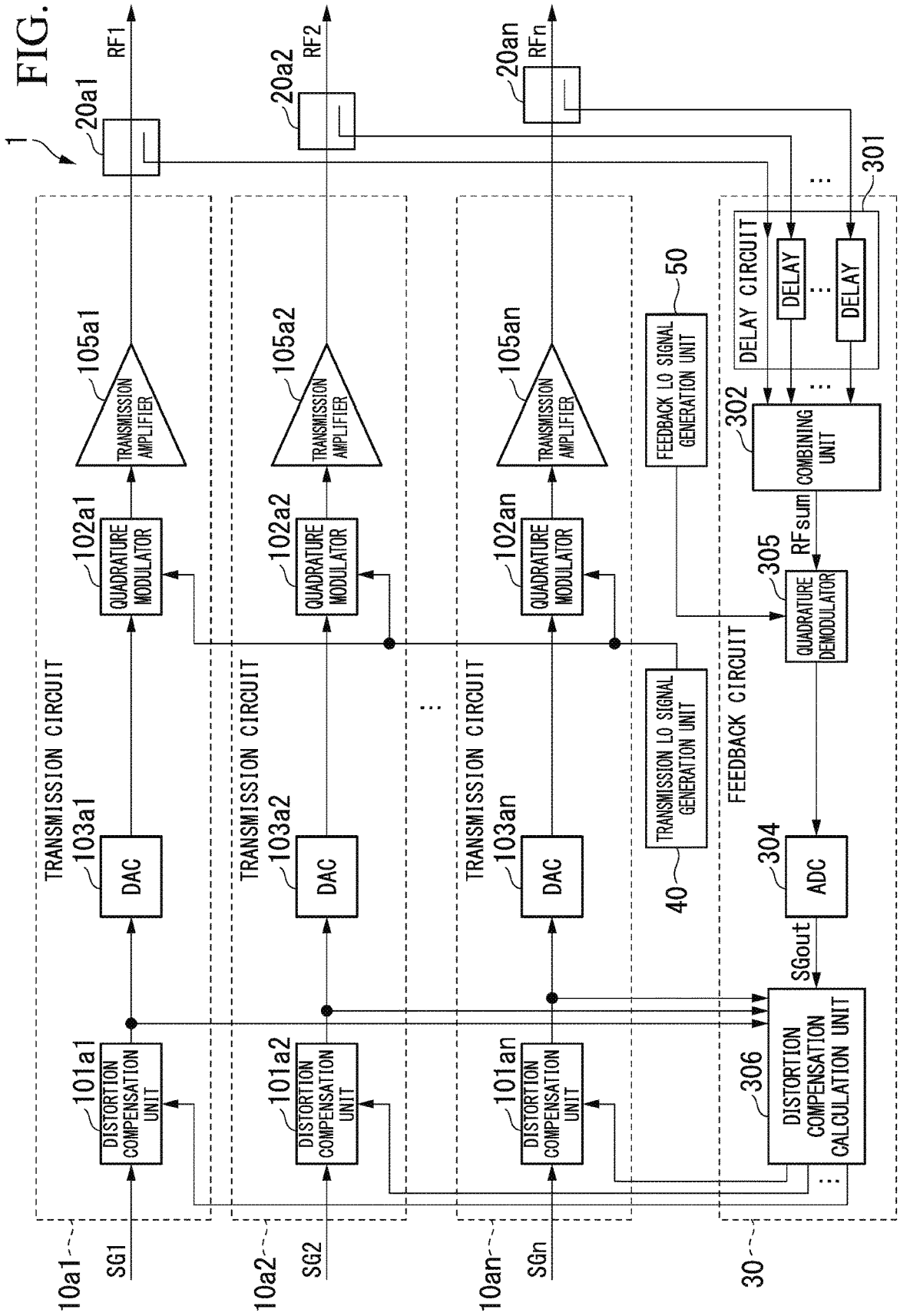
FIG. 5 is a diagram showing the constitution of a transmitter according to another exemplary embodiment of the present invention.

Also, for example, the transmitter 1 according to another exemplary embodiment of the present invention may use the direct-conversion system in both transmission and feedback, as shown in FIG. 5.

Figure 6:
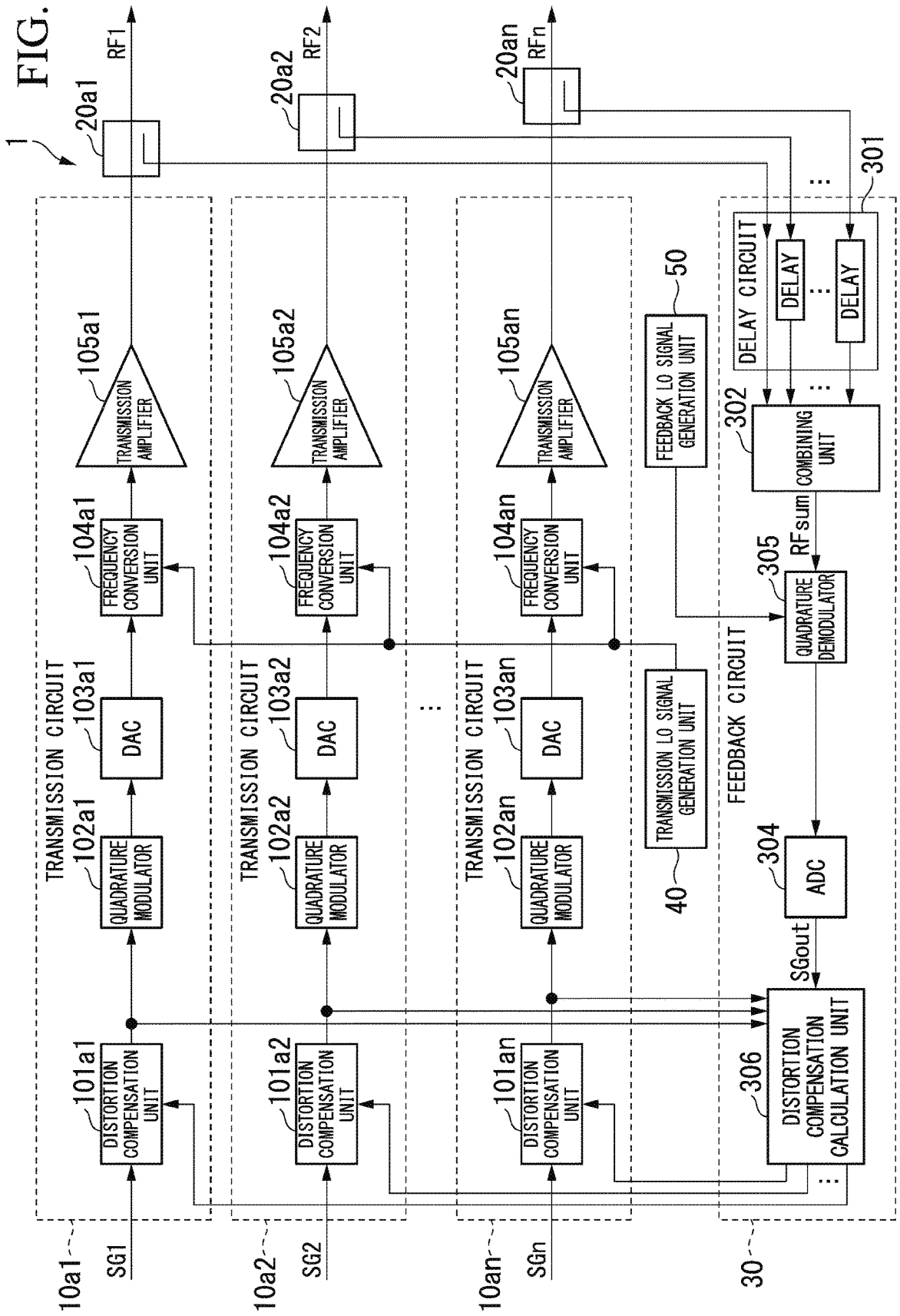
FIG. 6 is a diagram showing the constitution of a transmitter according to another exemplary embodiment of the present invention.

Also, for example, the transmitter 1 according to another exemplary embodiment of the present invention may use the superheterodyne system for transmission and the direct-conversion system for feedback as shown in FIG. 6.

Figure 7:
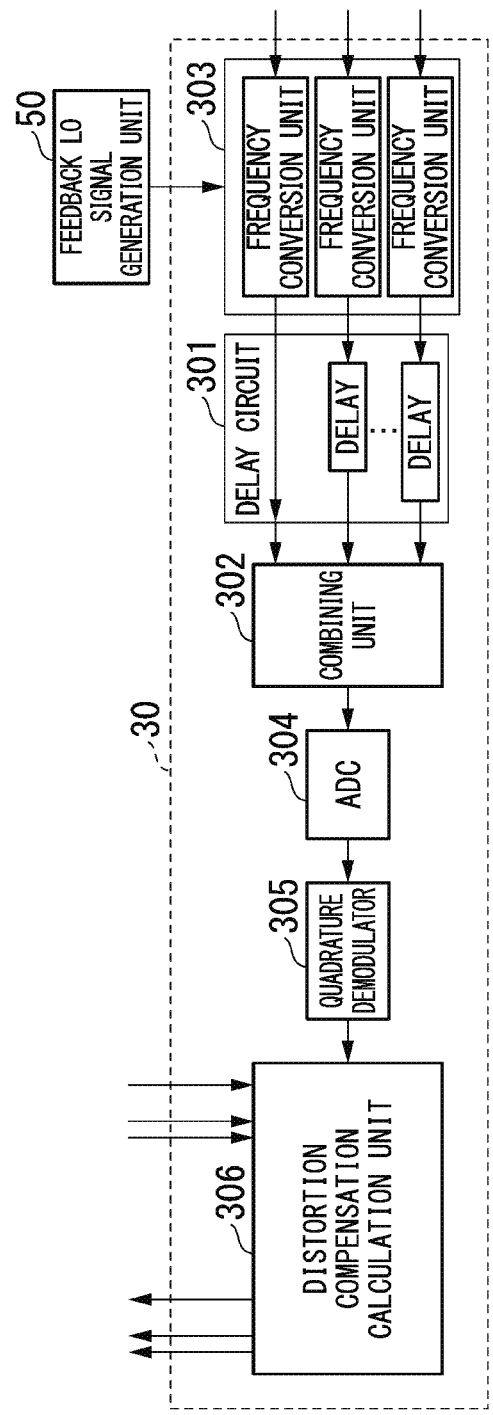
FIG. 7 is a diagram showing the constitution of a feedback circuit according to another exemplary embodiment of the present invention.

As shown in FIG. 7, the feedback circuit 30 according to another exemplary embodiment of the present invention includes a plurality of frequency conversion units 303 respectively corresponding to the first to nth transmission systems, and may perform signal processing in the order of the frequency conversion units 303, the delay circuit. 301, the combining unit 302, the ADC 304, the quadrature demodulator 305, and the distortion compensation calculation unit 306.

In this way, the output combined signal SGout obtained in the feedback circuit 30 is the same as the output combined signal SGout obtained in the feedback circuit 30 according to the first exemplary embodiment of the present invention, but the signal input to the delay circuit 301 and the combining unit 302 is an IF signal instead of an RF signal. As a result, the design as the transmitter 1 becomes easy.

In the configuration of the feedback circuit 30 shown in FIG. 7, a feedback LO signal generation unit 50 that supplies the feedback LO signal to the frequency conversion units 303 may be provided between the combining unit 302 and the ADC 304.

The feedback circuit 30 described above including the configuration shown in FIG. 7 may be used instead of the feedback circuit 30 of the transmitter 1 shown in FIGS. 4 to 6.

The transmitter 1 according to each exemplary embodiment of the present invention may be provided with a filter in the subsequent stage of the DAC 103a, the frequency conversion unit 104a, and the transmission amplifier 105a for image component removal, band limitation, and the like.

The configuration of the transmitter 1 according to each exemplary embodiment of the present invention does not depend on a communication method such as FDD (Frequency Division Duplex) or TDD (Time Division Duplex). Therefore, the transmitter 1 according to each exemplary embodiment of the present invention can be applied to both FDD and TDD communication systems. In particular, when the transmitter 1 according to each exemplary embodiment of the present invention is applied to a TDD communication method, the transmission LO signal generation unit 40 and the feedback LO signal generation unit 50 can be shared by one local signal generation unit.

Moreover, combinations of the techniques disclosed in the first and second exemplary embodiments of the present invention and the techniques disclosed in another exemplary embodiments of the present invention are also included in the exemplary embodiments of the present invention.

Next, the transmitter 1 according to one exemplary embodiment of the present invention will be described.

Figure 8:
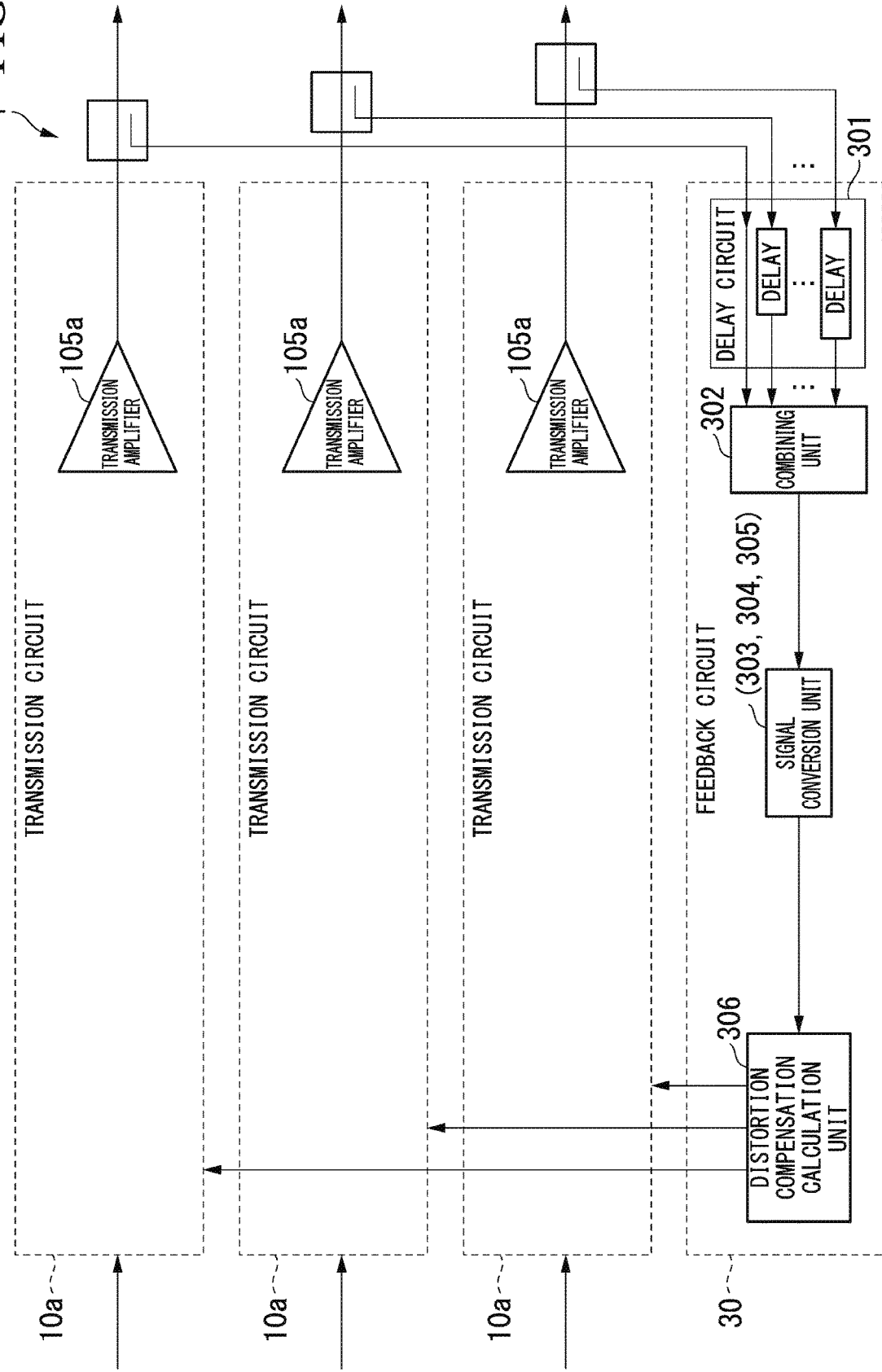
FIG. 8 is a diagram showing a transmitter according to one exemplary embodiment of the present invention.

As shown in FIG. 8, the transmitter 1 includes transmission circuits 10a and a feedback circuit 30 shared by the transmission circuits 10a.

The transmission circuits 10a form a plurality of transmission systems and generate signals in the same frequency band. The feedback circuit 30 feeds back, to each transmission circuit 10a that has output a transmission signal among the transmission circuits 10a, a distortion compensation coefficient calculated on the basis of a part of the power of the transmission signal output from the transmission circuit 10a via the transmission amplifier. The feedback circuit 30 includes a delay circuit 301, a combining unit 302, signal conversion units (303, 304, 305), and a distortion compensation calculation unit 306.

The delay circuit 301 delays each transmission signal by a different time. The combining unit 302 combines each of the signals delayed by the delay circuit 301 to generate a combined signal. The signal conversion units (303, 304, 305) convert the combined signal generated by the combining unit 302 to a different frequency using a common local signal for the plurality of transmission systems of the same frequency, and generate a demodulated digital signal from the converted signal. On the basis of the demodulated digital signal, the distortion compensation calculation unit 306 calculates a distortion compensation coefficient used when compensating for signal distortion in each of the outputs of the transmission circuits 10*a*.

In this way, the transmitter 1 can suppress an increase in the circuit scale.

Other Exemplary Embodiments

A transceiver according to an exemplary embodiment of the present invention will be described.

Figure 9:
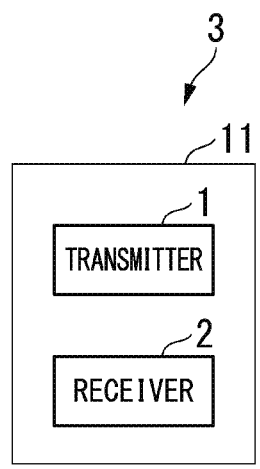
FIG. 9 is a diagram showing the constitution of a transceiver according to another exemplary embodiment of the present invention.

FIG. 9 is a diagram showing a constitution of the transceiver 3 according to another exemplary embodiment of the present invention. As shown in FIG. 9, the transceiver 3 according to another exemplary embodiment of the present invention includes one housing 11, a transmitter 1, and a receiver 2. The transmitter 1 is any one of the transmitters 1 according to the exemplary embodiments of the present invention described above. The receiver 2 is one receiver that receives a communication signal transmitted by a communication device other than the transmitter 1. The one transmitter 1 and the one receiver 2 are housed in the one housing 11 provided in the transceiver 3. The transceiver 3 communicates with a communication device other than the transceiver 3 by the transmitter 1 and the receiver 2 housed in this one housing 11.

Next, a communication system 4 including the transmitter 1 according to another exemplary embodiment of the present invention will be described.

Figure 10:
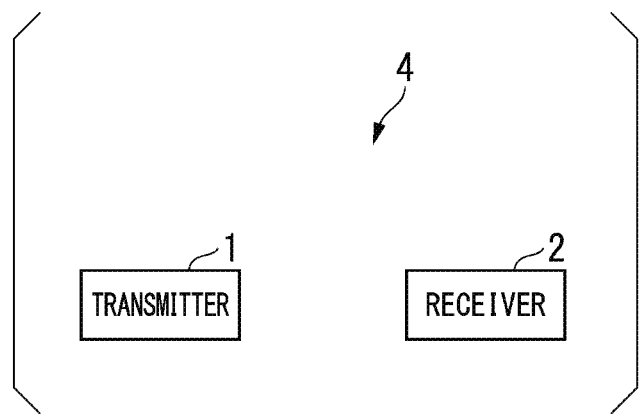
FIG. 10 is a first diagram showing a configuration example of a communication system according to another exemplary embodiment of the present invention.

The communication system 4 according to the exemplary embodiment of the present invention includes, for example, the transmitter 1 and the receiver 2 as shown in FIG. 10. The transmitter 1 is either the transmitter 1 according to the exemplary embodiment of the present invention or a modification thereof. The receiver 2 is a receiver provided with a receiving unit that receives a transmission signal transmitted by the transmitter 1 according to the exemplary embodiment of the present invention. In this case, in the transmitter 1 having a plurality of transmission systems, with the frequency bands of the RF signals at the output of the transmission systems being the same, the circuit scale can be reduced.

Figure 11:
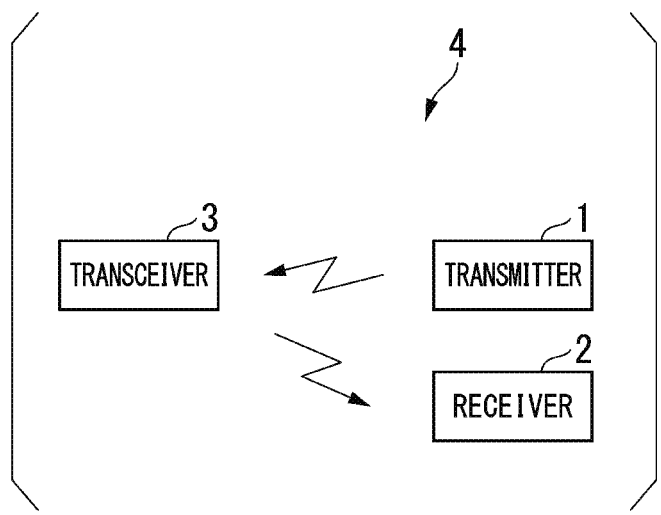
FIG. 11 is a second diagram showing a configuration example of a communication system according to another exemplary embodiment of the present invention.

The communication system 4 according to the exemplary embodiment of the present invention may be provided with, for example, the transceiver 3 and at least one of the transmitter 1 and the receiver 2 as shown in FIG. 11.

The transceiver 3 is either the transceiver 3 according to the other exemplary embodiment of the present invention or a modification thereof. The transmitter 1 is a communication device that transmits a communication signal to the transceiver 3. The receiver 2 is a communication device that receives the transmission amplification signal transmitted by the transceiver 3. When the transmitter 1 transmits a communication signal to the transceiver 3, in the transmitter 1 having a plurality of transmission systems with the frequency bands of the RF signals at the output of the transmission systems being the same, the circuit scale can be reduced. When the transceiver 3 transmits a transmission amplification signal to the receiver 2, in the transmitter 1 having a plurality of transmission systems provided in the transceiver 3, with the frequency bands of the RF signals at the output of the transmission systems being the same, the circuit scale can be reduced.

In the processing according to the exemplary embodiment of the present invention, the processing order may be changed within a range in which appropriate processing is performed.

Each of the storage unit and the storage device (including the register and the latch) in the exemplary embodiment of the present invention may be provided anywhere as long as appropriate information is transmitted and received. Each of the storage unit and the storage device may exist in a plurality within a range where appropriate information is transmitted and received, and the data may be stored in a distributed manner.

Although exemplary embodiments of the present invention have been described, the communication system 4, the transmitter 1, the receiver 2, the transceiver 3, and other control devices described above may have a computer system therein. The process described above is stored in a computer-readable recording medium in the form of a program, and the above processing is performed by the computer reading and executing this program. A specific example of a computer is shown below.

Figure 12:
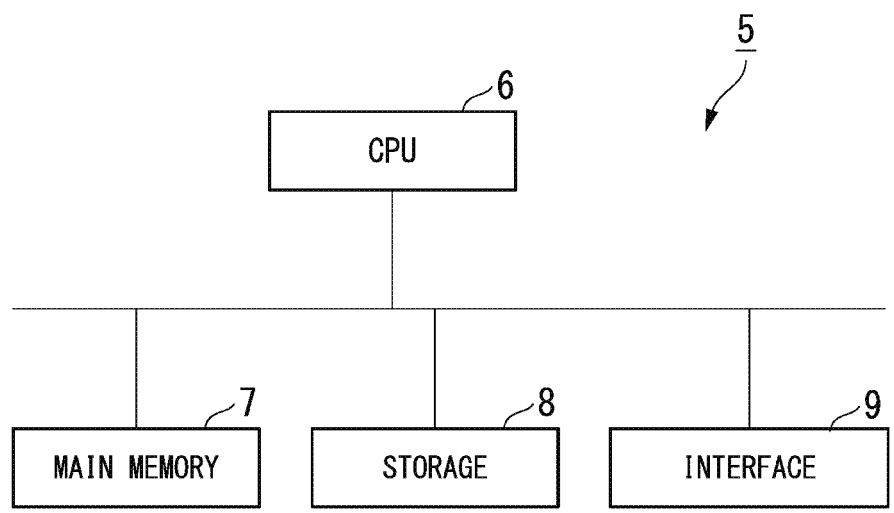
FIG. 12 is a schematic block diagram showing a configuration of a computer according to at least one exemplary embodiment.

FIG. 12 is a schematic block diagram showing a configuration of a computer according to at least one exemplary embodiment. As shown in FIG. 12, the computer 5 includes a CPU 6, a main memory 7, storage 8, and an interface 9.

For example, the communication system 4, the transmitter 1, the receiver 2, the transceiver 3, and other control devices described above are each mounted in the computer 5. The operation of each processing unit described above is stored in the storage 8 in the form of a program. The CPU 6 reads the program from the storage 8, develops the program in the main memory 7, and executes the above processing according to the program. Further, the CPU 6 secures a storage area corresponding to each of the above-described storage units in the main memory 7 according to the program.

Specific examples of the storage 8 may include a HDD (Hard Disk Drive), a SSD (Solid State Drive), a magnetic disk, a magneto-optical disk, a CD-ROM (Compact Disc Read Only Memory), a DVD-ROM (Digital Versatile Disc Read Only Memory), and semiconductor memory. The storage 8 may be an internal medium directly connected to the bus of the computer 5 or may be an external medium connected to the computer 5 via an interface 9 or a communication line. When this program is distributed to the computer 5 through a communication line, the computer 5 that has received the distribution may develop the program in the main memory 7 and execute the above processing. In at least one exemplary embodiment, the storage 8 is a non-transitory tangible storage medium.

The program may realize a part of the functions described above. Further, the program may be a file, a so-called differential file (differential program), that can realize the above-described functions in combination with a program already recorded in the computer system.

Although a number of exemplary embodiments of the present invention have been described, these exemplary embodiments are examples and do not limit the scope of the invention. Various additions, various omissions, various substitutions, and various changes may be made to these exemplary embodiments without departing from the gist of the invention.

A part or all of the above-described exemplary embodiments can be described as in the following supplementary notes, but are not limited thereto.

(Supplementary Note 1)

A transmitter comprising:

a transmission circuit that outputs, via a transmission amplifier, a plurality of transmission signals of a same frequency band; and a feedback circuit that feeds back, to the transmission circuit, a distortion compensation coefficient that is used to compensate for distortion of the plurality of transmission signals, wherein the feedback circuit comprises:

a delay circuit that delays each of the plurality of transmission signals by a different amount of time;

a combining unit that combines the plurality of delayed transmission signals to generate a combined signal;

a signal conversion unit that converts a frequency of the combined signal to a different frequency using a local signal that is common among the plurality of transmission signals, the signal conversion unit generating a demodulated digital signal from the combined signal of which the frequency has been converted; and a distortion compensation calculation unit that calculates the distortion compensation coefficient based on the demodulated digital signal.

(Supplementary Note 2)

The transmitter according to supplementary note 1, wherein the delay circuit delays each of the plurality of transmission signals by the different amount of time, the different amount of time being a time longer than a time indicated by reciprocal of bandwidth of the plurality of transmission signals.

(Supplementary Note 3)

The transmitter according to supplementary note 1 or supplementary note 2, wherein the delay circuit delays the plurality of transmission signals so that a difference between adjacent delay times when delay times of the plurality of transmission signals are arranged in an order starting from shortest is same.

(Supplementary Note 4)

The transmitter according to any one of supplementary notes 1 to 3, wherein modulation in the transmission circuit is a superheterodyne system or a direct-conversion system, and demodulation in the feedback circuit is the superheterodyne system or the direct-conversion system.

(Supplementary Note 5)

The transmitter according to supplementary note 4, wherein the demodulation in the feedback circuit is the direct-conversion system in a case where the modulation in the transmission circuit is the superheterodyne system, and the demodulation in the feedback circuit is the superheterodyne system in a case where the modulation in the transmission circuit is the direct-conversion system.

(Supplementary Note 6)

The transmitter according to supplementary note 4, wherein the demodulation in the feedback circuit is the superheterodyne system in a case where the modulation in the transmission circuit is the superheterodyne system, and the demodulation in the feedback circuit is the direct-conversion system in a case where the modulation in the transmission circuit is the direct-conversion system.

(Supplementary Note 7)

The transmitter according to any one of supplementary notes 1 to 6, wherein the transmission circuit comprises:

a distortion compensation unit that performs signal processing on an input signal to suppress distortion of the plurality of transmission signals;

a plurality of amplitude and phase adjustment units each of which adjusts an amplitude and phase of a corresponding transmission signal and outputs a transmission signal of which the amplitude and phase have been adjusted; and a plurality of transmission amplifiers each of which amplifies a transmission signal that has been output from a corresponding amplitude and phase adjustment unit and of which the amplitude and phase has been adjusted, and wherein the distortion compensation unit calculates an average value of distortion characteristics of the plurality of transmission amplifiers, and outputs, to the distortion compensation unit, a parameter of an inverse distortion characteristic calculated based on the calculated average value.

(Supplementary Note 8)

The transmitter according to supplementary note 7, wherein a number of the transmission circuits is three or more; and a number of the distortion compensation units is two or more and less than or equal to a number of the transmission signals.

(Supplementary Note 9)

A communication system comprising:

the transmitter according to any one of supplementary note 1 to supplementary note 8; and a receiver that receives a transmission signal transmitted by the transmitter.

(Supplementary Note 10)

A method for controlling a transmitter that comprises a transmission circuit, the method comprising:

outputting a plurality of transmission signals of a same frequency band from the transmission circuit via a transmission amplifier;

delaying each of the plurality of transmission signals by a different amount of time;

combining the plurality of delayed transmission signals to generate a combined signal;

converting a frequency of the combined signal to a different frequency using a local signal that is common among the plurality of transmission signals;

generating a demodulated digital signal from the combined signal of which the frequency has been converted;

calculating a distortion compensation coefficient that is used to compensate for distortion of the plurality of transmission signals, based on the demodulated digital signal; and feeding back the distortion compensation coefficient to the transmission circuit.

(Supplementary Note 11)

A program for causing a computer of a transmitter that comprises a transmission circuit, to execute:

outputting a plurality of transmission signals of a same frequency band from the transmission circuit via a transmission amplifier;

delaying each of the plurality of transmission signals by a different amount of time;

combining the plurality of delayed transmission signals to generate a combined signal;

converting a frequency of the combined signal to a different frequency using a local signal that is common among the plurality of transmission signals;

generating a demodulated digital signal from the combined signal of which the frequency has been converted;

calculating a distortion compensation coefficient that is used to compensate for distortion of the plurality of transmission signals, based on the demodulated digital signal; and feeding back the distortion compensation coefficient to the transmission circuit.

This application claims priority based on Japanese Patent Application No. 2017-088950, filed Apr. 27, 2017, the entire disclosure of which is incorporated herein.

INDUSTRIAL APPLICABILITY

The present invention may be applied to a communication system, and a method and a program for controlling a transmitter.

REFERENCE SYMBOLS

1: Transmitter
2: Receiver
3: Transceiver
4: Communication system
5: Computer
6: CPU
7: Main memory
8: Storage
9: Interface
10a, 10a1, 10a2, 10an: Transmission circuit
11: Housing
20a, 20a1, 20a2, 20an: Signal branching unit
30: Feedback circuit
40: Transmission LO signal generation unit
50: Feedback LO signal generation unit
101a, 101a1, 101a2, 101an: Distortion compensation unit
102a, 102a1, 102a2, 102an: Quadrature modulator
103a, 103a1, 103a2, 103an: DAC (Digital to Analog Converter)
104a, 104a1, 104a2, 104an: Frequency conversion unit
105a, 105a1, 105a2, 105an: Transmission amplifier
301: Delay circuit
302: Combining unit
303: Frequency conversion unit
304: ADC (Analog to Digital Converter)
305: Quadrature demodulator
306: Distortion compensation calculation unit

What is claimed is:

1. A transmitter comprising:
a transmission circuit that outputs, via a transmission amplifier, a plurality of transmission signals of a same frequency band; and
a feedback circuit that feeds back, to the transmission circuit, a distortion compensation coefficient that is used to compensate for distortion of the plurality of transmission signals,
wherein the feedback circuit comprises:
a delay circuit that delays each of the plurality of transmission signals by a different amount of time;
a combining unit that combines the plurality of delayed transmission signals to generate a combined signal;
a signal conversion unit that converts a frequency of the combined signal to a different frequency using a local signal that is common among the plurality of transmission signals, the signal conversion unit generating a demodulated digital signal from the combined signal of which the frequency has been converted; and
a distortion compensation calculation unit that calculates the distortion compensation coefficient based on the demodulated digital signal.

2. The transmitter according to claim 1, wherein the delay circuit delays each of the plurality of transmission signals by the different amount of time, the different amount of time being a time longer than a time indicated by reciprocal of bandwidth of the plurality of transmission signals.

3. The transmitter according to claim 1, wherein the delay circuit delays the plurality of transmission signals so that a difference between adjacent delay times when delay times of the plurality of transmission signals are arranged in an order starting from shortest is same.

4. The transmitter according to claim 1,
wherein modulation in the transmission circuit is a superheterodyne system or a direct-conversion system, and demodulation in the feedback circuit is the superheterodyne system or the direct-conversion system.

5. The transmitter according to claim 4,
wherein the demodulation in the feedback circuit is the direct-conversion system in a case where the modulation in the transmission circuit is the superheterodyne system, and
the demodulation in the feedback circuit is the superheterodyne system in a case where the modulation in the transmission circuit is the direct-conversion system.

6. The transmitter according to claim 4,
wherein the demodulation in the feedback circuit is the superheterodyne system in a case where the modulation in the transmission circuit is the superheterodyne system, and
the demodulation in the feedback circuit is the direct-conversion system in a case where the modulation in the transmission circuit is the direct-conversion system.

7. The transmitter according to claim 1,
wherein the transmission circuit comprises:
a distortion compensation unit that performs signal processing on an input signal to suppress distortion of the plurality of transmission signals;
a plurality of amplitude and phase adjustment units each of which adjusts an amplitude and phase of a corresponding transmission signal and outputs a transmission signal of which the amplitude and phase have been adjusted; and
a plurality of transmission amplifiers each of which amplifies a transmission signal that has been output from a corresponding amplitude and phase adjustment unit and of which the amplitude and phase has been adjusted, and
wherein the distortion compensation unit calculates an average value of distortion characteristics of the plurality of transmission amplifiers, and outputs, to the distortion compensation unit, a parameter of an inverse distortion characteristic calculated based on the calculated average value.

8. The transmitter according to claim 7,
wherein a number of the transmission circuits is three or more; and
a number of the distortion compensation units is two or more and less than or equal to a number of the transmission signals.

9. A communication system comprising:
the transmitter according to claim 1; and
a receiver that receives a transmission signal transmitted by the transmitter.

10. A method for controlling a transmitter that comprises a transmission circuit, the method comprising:
outputting a plurality of transmission signals of a same frequency band from the transmission circuit via a transmission amplifier;
delaying each of the plurality of transmission signals by a different amount of time;

combining the plurality of delayed transmission signals to generate a combined signal;

converting a frequency of the combined signal to a different frequency using a local signal that is common among the plurality of transmission signals;

generating a demodulated digital signal from the combined signal of which the frequency has been converted;

calculating a distortion compensation coefficient that is used to compensate for distortion of the plurality of transmission signals, based on the demodulated digital signal; and feeding back the distortion compensation coefficient to the transmission circuit.

11. A non-transitory computer-readable recording medium storing a program for causing a computer of a transmitter that comprises a transmission circuit, to execute:

outputting a plurality of transmission signals of a same frequency band from the transmission circuit via a transmission amplifier;

delaying each of the plurality of transmission signals by a different amount of time;

combining the plurality of delayed transmission signals to generate a combined signal;

converting a frequency of the combined signal to a different frequency using a local signal that is common among the plurality of transmission signals;

generating a demodulated digital signal from the combined signal of which the frequency has been converted;

calculating a distortion compensation coefficient that is used to compensate for distortion of the plurality of transmission signals, based on the demodulated digital signal; and feeding back the distortion compensation coefficient to the transmission circuit.

* * * * *